US012811601B2

(12) United States Patent
Wang et al.

(10) Patent No.: US 12,811,601 B2
(45) Date of Patent: Nov. 24, 2026

(54) HIGH-LINEARITY TAILLESS CURRENT STEERING DIGITAL-TO-ANALOG CONVERTER

(71) Applicant: JOYWELL SEMICONDUCTOR (SHANGHAI) CO., LTD., Shanghai (CN)

(72) Inventors: Nan Wang, Shanghai (CN); Seung Chul Lee, Shanghai (CN)

(73) Assignee: JOYWELL SEMICONDUCTOR (SHANGHAI) CO., LTD., Shanghai (CN)

( * ) Notice: Subject to any disclaimer, the term of this patent is extended or adjusted under 35 U.S.C. 154(b) by 121 days.

(21) Appl. No.: 19/108,098

(22) PCT Filed: Aug. 14, 2023

(86) PCT No.: PCT/CN2023/112939

§ 371 (c)(1),
(2) Date: Mar. 18, 2025

(87) PCT Pub. No.: WO2024/046106

PCT Pub. Date: Mar. 7, 2024

(65) Prior Publication Data

US 2025/0373259 A1 Dec. 4, 2025

(30) Foreign Application Priority Data

Sep. 1, 2022 (CN) ......................... 202211067876.9

(51) Int. Cl.
*H03M 1/66* (2006.01)
*H03K 17/687* (2006.01)

(52) U.S. Cl.
CPC .......... *H03M 1/66* (2013.01); *H03K 17/6872* (2013.01)

(58) Field of Classification Search
CPC ...... H03M 1/66; H03M 1/0604; H03M 1/742; H03M 1/0656; H03K 17/6872
See application file for complete search history.

(56) References Cited

U.S. PATENT DOCUMENTS 4,888,499 A * 12/1989 Sanwo ................ H03K 19/215
326/54
5,241,225 A * 8/1993 Okajima .......... H03K 3/356069
326/73

(Continued)

FOREIGN PATENT DOCUMENTS

CN 115412092 A 11/2022

OTHER PUBLICATIONS

International Search Report (with English translation) and Written Opinion issued in PCT/CN2023/112939, mailed Nov. 8, 2023, 9 pages provided.

*Primary Examiner* — Lam T Mai
(74) *Attorney, Agent, or Firm* — HSML P.C.

(57) ABSTRACT

Disclosed in the present application is a high-linearity tailless current steering digital-to-analog converter (DAC). The high-linearity tailless current steering DAC comprises: several bit digital-to-analog conversion units, an operational amplifier and a current source. Each unit comprises: first and second load PMOS transistors, first and second load resistors, and first to fourth NMOS transistors, wherein a drain terminal of the first load PMOS transistor is connected to a drain terminal of the first NMOS transistor and an end of the first load resistor, a drain terminal of the second load PMOS transistor is connected to a drain terminal of the second NMOS transistor and an end of the second load resistor, a source terminal of the first NMOS transistor is connected to a drain terminal of the third NMOS transistor, a source terminal of the second NMOS transistor is connected to a drain terminal of the fourth NMOS transistor, and gate terminals of the third and fourth NMOS transistors are respectively connected to a pair of differential input signals. Gate terminals of the first and second load PMOS transistors are connected to an output of the operational amplifier, the (Continued)

other ends of the first and second load resistors are connected to a positive input terminal of the operational amplifier, and a negative input terminal of the operational amplifier is connected to a reference voltage. The current source is connected to gate terminals of the first and second NMOS transistors. Accordingly, a high-linearity tailless DAC is implemented in high-speed and high-swing applications.

7 Claims, 3 Drawing Sheets

(56) References Cited

U.S. PATENT DOCUMENTS 6,278,319 B1 * 8/2001 Chen .............. H03K 19/018521 326/104
7,098,826 B2 * 8/2006 Madireddy ......... H04L 12/2854 341/141
9,548,752 B1 1/2017 Shrivastava et al.
9,813,071 B1 11/2017 An et al.
10,862,500 B1 12/2020 Pelliconi et al.
2002/0024851 A1 * 2/2002 Kawasumi ............ G11C 11/412 365/189.08
2006/0033525 A1 * 2/2006 Mair ................ H03K 19/00315 326/33
2007/0194836 A1 * 8/2007 Kim .................... H04W 52/028 327/538
2009/0303094 A1 * 12/2009 Pun .......................... H03K 5/22 341/144
2012/0154189 A1 * 6/2012 Cho ................. H03K 17/04106 327/109
2019/0305790 A1 10/2019 Kinyua et al.
2024/0056043 A1 * 2/2024 Singh .................. H03F 3/45179

* cited by examiner

HIGH-LINEARITY TAILLESS CURRENT STEERING DIGITAL-TO-ANALOG CONVERTER

TECHNICAL FIELD

The present invention generally relates to the field of integrated circuit technology, particularly to a high-linearity tailless current steering digital-to-analog converter.

BACKGROUND

Traditional tailless high-speed digital-to-analog converters (DACs) have linearity issues, as shown in FIG. 1, because the output common mode is set by $$V_{out\_CM}=\left(VDD-\frac{1}{2}*I_{dac}*R_L\right),$$

wherein $R_L$ is equal to 50 ohms mostly, and $I_{dac}$ is mainly determined by swing requirements. Applications with higher swing are usually accompanied by a lower output common mode, which creates margin problems for the NMOS transistors ($M_{N1}/M_{N2}$) of the DAC.

SUMMARY

The purpose of the present invention is to provide a high-linearity tailless current-steering digital-to-analog converter that employs linearization techniques in high-speed, high-swing applications.

The present application discloses a high-linearity tailless current-steering digital-to-analog converter, comprising:

- digital-to-analog conversion units for a plurality of bits, each of the digital-to-analog conversion units comprising: first and second load PMOS transistors, first and second load resistors, and first to fourth NMOS transistors, wherein source terminals of the first and second load PMOS transistors are both connected to a power supply terminal, a drain terminal of the first load PMOS transistor is connected to a drain terminal of the first NMOS transistor and an end of the first load resistor, a drain terminal of the second load PMOS transistor is connected to a drain terminal of the second NMOS transistor and an end of the second load resistor, a source terminal of the first NMOS transistor is connected to a drain terminal of the third NMOS transistor, a source terminal of the second NMOS transistor is connected to a drain terminal of the fourth NMOS transistor, gate terminals of the third and fourth NMOS transistors are respectively connected to a pair of differential input signals, and source terminals of the third and fourth NMOS transistors are both connected to a ground terminal;
- an operational amplifier, wherein gate terminals of the first and second load PMOS transistors are both connected to an output terminal of the operational amplifier, the other ends of the first and second load resistors are connected together and connected to a positive input terminal of the operational amplifier, a negative input terminal of the operational amplifier is connected to a reference voltage, and a first capacitor is connected in series between the output terminal of the operational amplifier and the ground terminal; and
- a current source connected to gate terminals of the first and second NMOS transistors In a preferred embodiment, the converter further comprises: fifth and sixth NMOS transistors, wherein a gate terminal and a drain terminal of the fifth NMOS transistor are both connected to the current source, a source terminal of the fifth NMOS transistor is connected to a drain terminal of the sixth NMOS transistor, a gate terminal of the sixth NMOS transistor is connected to the power supply terminal, and a source terminal of the sixth NMOS transistor is connected to the ground terminal.

In a preferred embodiment, the converter further comprises: a reference voltage generation circuit that comprises: a voltage divider resistor string, a seventh NMOS transistor and an eighth NMOS transistor, wherein the voltage divider resistor string is connected in series between the power supply terminal and a drain terminal of the seventh NMOS transistor and outputs the reference voltage, a gate terminal of the seventh NMOS transistor is connected to the current source, a source terminal of the seventh NMOS transistor is connected to a drain terminal of the eighth NMOS transistor, a gate terminal of the eighth NMOS transistor is connected to the power supply terminal, a source terminal of the eighth NMOS transistor is connected to the ground terminal, wherein currents of the seventh and eighth NMOS transistors are the same as currents of the first to fourth NMOS transistors of the least significant bit of digital-to-analog conversion unit.

In a preferred embodiment, the voltage divider resistor string comprises a plurality of resistors connected in series between the power supply terminal and the drain terminal of the seventh NMOS transistor, and each node between adjacent resistors is connected to the negative input terminal of the operational amplifier via a switch.

In a preferred embodiment, the converter further comprises: third and fourth load resistors, wherein the third load resistor is connected in parallel between the source terminal and the drain terminal of the first load PMOS transistor, and the fourth load resistor is connected in parallel between the source terminal and the drain terminal of the second load PMOS transistor.

In a preferred embodiment, the converter further comprises: a second capacitor, wherein an end of the second capacitor is connected to gate terminals of the first, second and fifth NMOS transistors, and the other end of the second capacitor is connected to the ground terminal.

In a preferred embodiment, the converter further comprises: a third resistor and a third capacitor, wherein the other ends of the first and second load resistors are connected to each other at a connection point, and the third resistor is connected in series between the connection point and the positive input terminal of the operational amplifier, an end of the third capacitor is connected to the positive input terminal of the operational amplifier, and the other end of the third capacitor is connected to the ground terminal.

Compared to the prior art, the high-linearity tailless current-steering digital-to-analog converter of the present application has at least the following advantageous effects:

1. The proposed circuit describes a current-steering tailless DAC adopting linearization techniques in high-speed, high-swing applications. The margin problems of NMOS transistors are resolved, providing better linearity.
2. The output common mode is freed from the constraint defined by $$V_{out\_CM}=\left(VDD-\frac{1}{2}*I_{dac}*R_L\right).$$

reference voltage generation circuit in the application, the output common mode can be flexibly controlled by adjusting the reference voltage.

3. Controllable output swing is achieved through the adjustable current source circuit.
4. In applications with advanced process nodes (such as 14 nm, 7 nm), simultaneously controllable output common mode and output swing greatly assist the reliability of NMOS transistors, resolving transistor aging issues.

A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time. Feature E can be combined with feature C technically. Then, the A+B+C+D scheme should not be regarded as already recorded because of the technical infeasibility, and A+B+C+E scheme should be considered as already documented.

DETAILED DESCRIPTION

In the following description, numerous technical details are set forth in order to provide a thorough understanding of the present application. However, those skilled in the art can understand that the technical solution claimed in this application can be realized without these technical details and various changes and modifications based on the following embodiments.

In order to make the objectives, technical solutions, and advantages of the present application clearer, embodiments of the present application will be further described in detail below with reference to the drawings.

Figure 1:
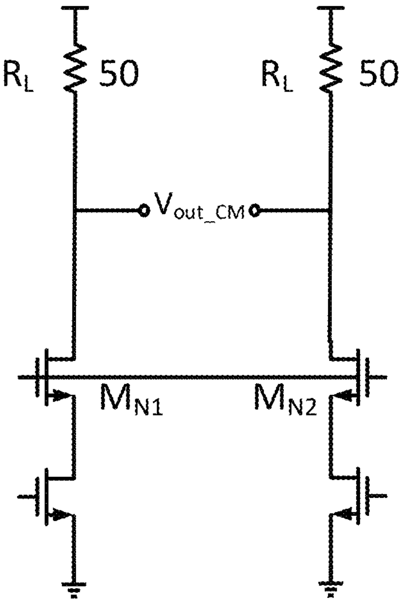
FIG. 1 is a circuit diagram of a traditional tailless high-speed digital-to-analog converter.
Figure 2:
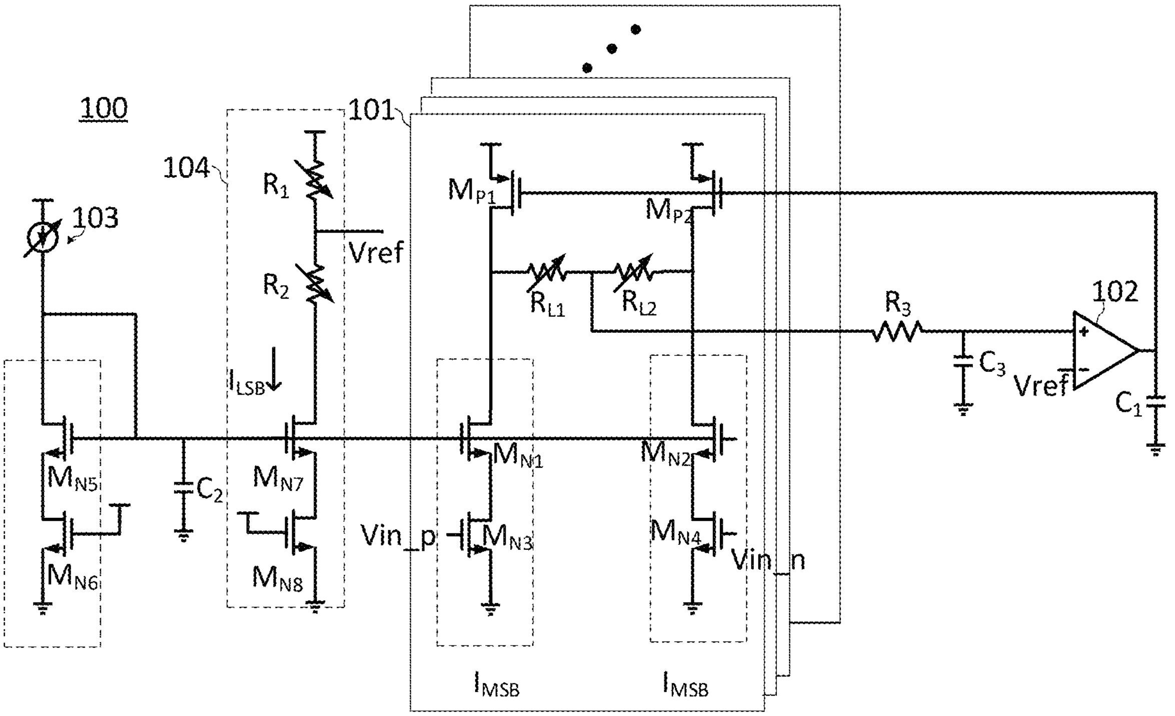
FIG. 2 is a circuit diagram of a tailless current-steering digital-to-analog converter in an embodiment of the present application.
Figure 3:
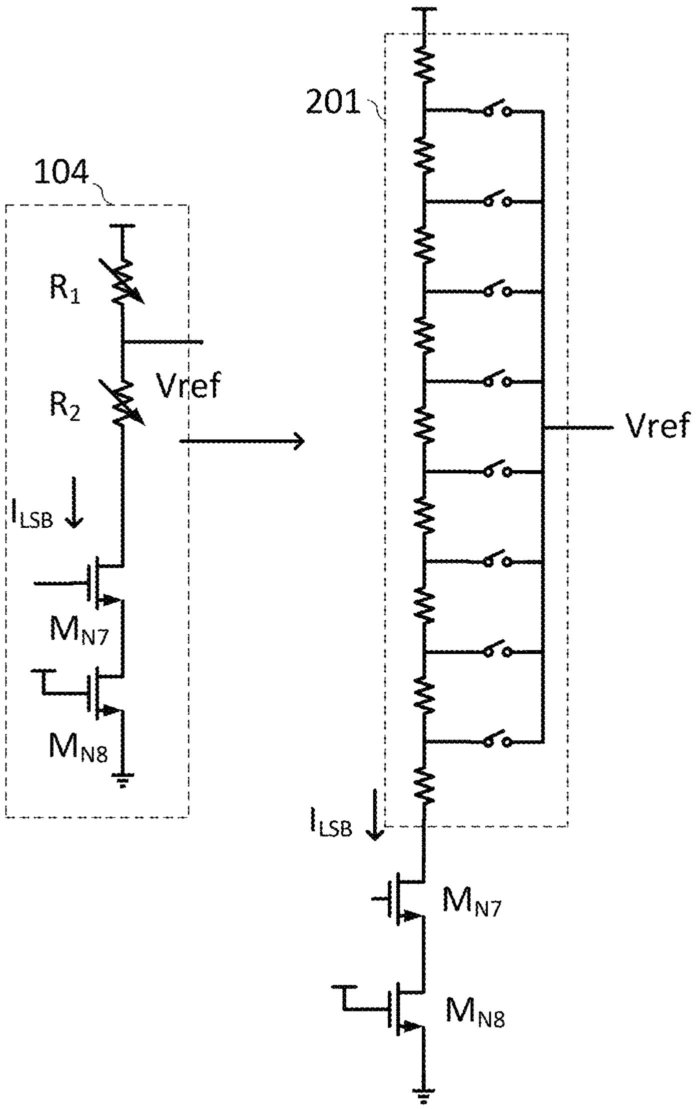
FIG. 3 is a circuit diagram of a reference voltage generation circuit in an embodiment of the present application.

The present application discloses a high-linearity tailless current-steering digital-to-analog converter. FIG. 2 shows a circuit diagram of a tailless current-steering digital-to-analog converter 100 in an embodiment. The digital-to-analog converter 100 includes: digital-to-analog conversion units 101 for a plurality bits, an operational amplifier 102, a programmable current source 103, and a reference voltage generation circuit 104.

Each digital-to-analog conversion unit 101 includes: a first load PMOS transistor $M_{P1}$ and a second load PMOS transistor $M_{P2}$, a first load resistor $R_{L1}$ and a second load resistor $R_{L2}$, and a first NMOS transistor $M_{N1}$, a second NMOS transistor $M_{N2}$, a third NMOS transistor $M_{N3}$, and a fourth NMOS transistor $M_{N4}$. The source terminals of the first load PMOS transistor $M_{P1}$ and the second load PMOS transistor $M_{P2}$ are both connected to a power supply terminal, the drain terminal of the first load PMOS transistor $M_{P1}$ is connected to the drain terminal of the first NMOS transistor $M_{N1}$ and an end of the first load resistor $R_{L1}$, the drain terminal of the second load PMOS transistor $M_{P2}$ is connected to the drain terminal of the second NMOS transistor $M_{N2}$ and an end of the second load resistor $R_{L2}$, the source terminal of the first NMOS transistor $M_{N1}$ is connected to the drain terminal of the third NMOS transistor $M_{N3}$, the source terminal of the second NMOS transistor $M_{N2}$ is connected to the drain terminal of the fourth NMOS transistor $M_{N4}$, the gate terminals of the third NMOS transistor $M_{N3}$ and the fourth NMOS transistor $M_{N4}$ are respectively connected to a pair of differential input signals Vin_p and Vin_n, and the source terminals of the third NMOS transistor $M_{N3}$ and the fourth NMOS transistor $M_{N4}$ are both connected to a ground terminal. FIG. 2 shows the most significant bit (MSB) of digital-to-analog conversion unit 101.

The gate terminals of the first load PMOS transistor $M_{P1}$ and the second load PMOS transistor $M_{P2}$ are both connected to the output terminal of the operational amplifier 102, the other ends of the first load resistor $R_{L1}$ and the second load resistor $R_{L2}$ are connected together and connected to the positive input terminal of the operational amplifier 102, the negative input terminal of the operational amplifier 102 is connected to a reference voltage Vref, and a first capacitor C1 is connected in series between the output terminal of the operational amplifier 102 and the ground terminal. The current source is connected to the gate terminals of the first NMOS transistor $M_{N1}$ and the second NMOS transistor $M_{N2}$.

To solve the linearity problem under high swing requirements, the application introduces a novel CMFB (common-mode feedback) controlled PMOS ($M_{P1}/M_{P2}$) parallel tailless DAC, as shown in FIG. 2. Here, $R_{L1}$ and $R_{L2}$ can serve two functions: detecting the output common mode and maintaining the output impedance of the DAC.

In an embodiment, the digital-to-analog converter 100 further includes: a fifth NMOS transistor $M_{N5}$ and a sixth NMOS transistor $M_{N6}$, wherein the gate terminal and the drain terminal of the fifth NMOS transistor $M_{N5}$ are connected to the programmable current source 103, the source terminal of the fifth NMOS transistor $M_{N5}$ is connected to the drain terminal of the sixth NMOS transistor $M_{N6}$, the gate terminal of the sixth NMOS transistor $M_{N6}$ is connected to the power supply terminal, and the source terminal of the sixth NMOS transistor $M_{N6}$ is connected to the ground terminal.

In an embodiment, the reference voltage generation circuit 104 includes: a voltage divider resistor string 201, a seventh NMOS transistor $M_{N7}$ and an eighth NMOS transistor $M_{N8}$, wherein the voltage divider resistor string 201 is connected in series between the power supply terminal and the drain terminal of the seventh NMOS transistor $M_{N7}$ and outputs a reference voltage Vref, the gate terminal of the seventh NMOS transistor $M_{N7}$ is connected to the programmable current source 103, the source terminal of the seventh NMOS transistor $M_{N7}$ is connected to the drain terminal of the eighth NMOS transistor $M_{N8}$, the gate terminal of the eighth NMOS transistor $M_{N8}$ is connected to the power supply terminal, the source terminal of the eighth NMOS transistor $M_{N8}$ is connected to the ground terminal, wherein the current of the seventh NMOS transistor $M_{N7}$ and the eighth NMOS transistor $M_{N8}$ is the same as the current $I_{LSB}$ of the first NMOS transistor $M_{N1}$, the second NMOS transistor $M_{N2}$, the third NMOS transistor $M_{N3}$, and the fourth NMOS transistor $M_{N4}$ of the least significant bit (LSB) digital-to-analog conversion unit 101.

In an embodiment, the voltage divider resistor string 201 includes a plurality of resistors (for example, 9) connected in series between the power supply terminal and the drain terminal of the seventh NMOS transistor $M_{N7}$, and each node between adjacent resistors is connected to the negative input terminal of the operational amplifier 102 via a switch and outputs the reference voltage Vref to the operational amplifier 102. In this embodiment, the number of resistors connected in series in the voltage divider resistor string is controlled by controlling the switches, thereby adjusting the reference voltage Vref.

In an embodiment, the digital-to-analog converter 100 further includes: a second capacitor C2, wherein an end of the second capacitor C2 is connected to the gate terminals of the first NMOS transistor $M_{N1}$, the second NMOS transistor $M_{N2}$, and the fifth NMOS transistor $M_{N5}$, and the other end of the second capacitor C2 is connected to the ground terminal.

In an embodiment, the digital-to-analog converter 100 further includes: a third resistor R3 and a third capacitor C3, wherein the third resistor R3 is connected in series between the connection point of the other ends of the first load resistor $R_{L1}$ and the second load resistor $R_{L2}$ and the positive input terminal of the operational amplifier 102, an end of the third capacitor C3 is connected to the positive input terminal of the operational amplifier 102, and the other end is connected to the ground terminal.

Figure 4:
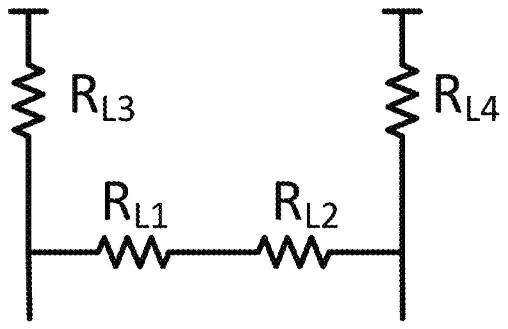
FIG. 4 is a schematic diagram of load resistors in another embodiment of the present application.
Figure 5:
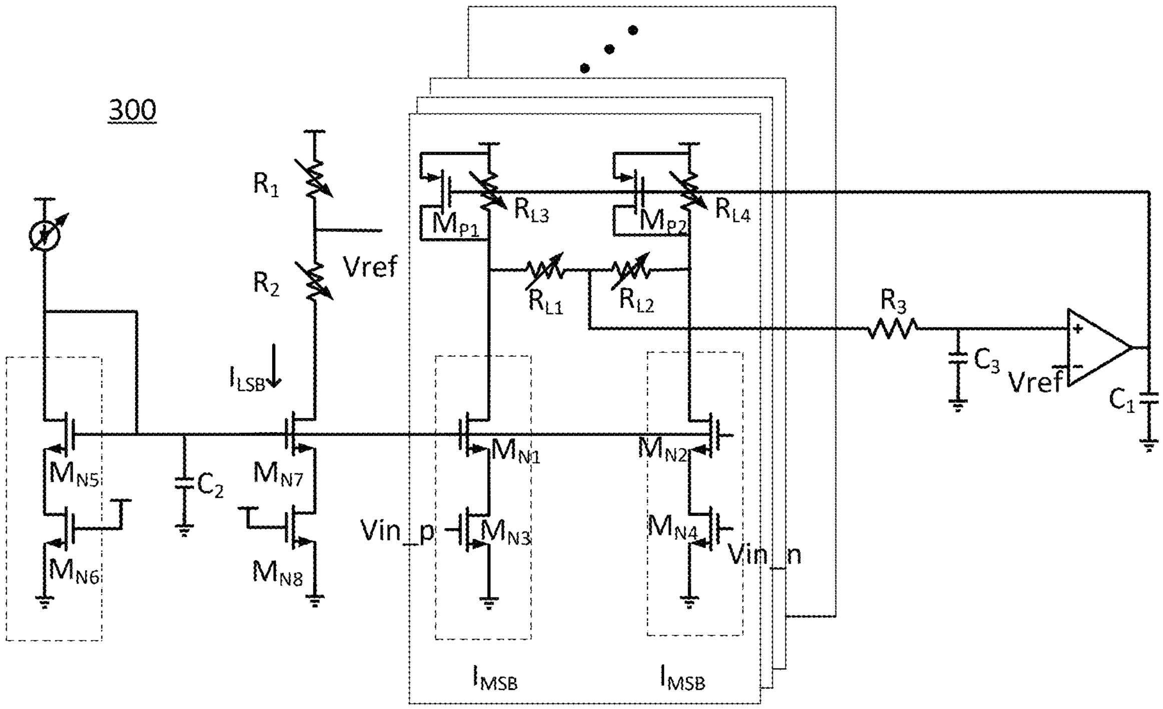
FIG. 5 is a circuit diagram of a tailless current-steering digital-to-analog converter in another embodiment of the present application.

FIG. 4 shows an implementation of the load resistors in another embodiment. Here, $R_{L1}$ is in parallel with $R_{L3}$, and $R_{L2}$ is in parallel with $R_{L4}$, instead of using $R_{L1}=R_{L2}=50$ ohms. It should be noted that $R_{L3}$ and $R_{L4}$ can be connected to another common-mode voltage or power supply, rather than sharing the same power supply as the PMOS ($M_{P1}$/$M_{P2}$) used. FIG. 5 shows a circuit diagram of a tailless current-steering digital-to-analog converter 300 in another embodiment. The structure of the digital-to-analog converter 300 is basically the same as that of the digital-to-analog converter 100, and the main difference is: in addition to the first load resistor $R_{L1}$ and the second load resistor $R_{L2}$, the digital-to-analog converter 300 further includes: a third load resistor $R_{L3}$ and a fourth load resistor $R_{L4}$, wherein the third load resistor $R_{L3}$ is connected in parallel between the source terminal and the drain terminal of the first load PMOS transistor $M_{P1}$, and the fourth load resistor $R_{L4}$ is connected in parallel between the source terminal and the drain terminal of the second load PMOS transistor $M_{P2}$. FIG. 5 shows the entire digital-to-analog converter 300 circuit, where the load PMOS transistors work together with the load resistors $R_{L1}$, $R_{L2}$, $R_{L3}$, and $R_{L4}$ to achieve highly linear performance.

It should be noted that in the specification of the present invention, relational terms such as first, second, etc. are used only to distinguish one entity or operation from another entity or operation, and do not necessarily require or imply any actual relationship or sequence between such entities or operations. Moreover, the term "comprise", "include", or any other variants thereof are intended to cover a non-exclusive inclusion, such that a process, method, article, or apparatus that comprises a list of elements not only comprises those elements, but may also comprise other elements not expressly listed or inherent to such a process, method, article, or apparatus. Without further limitations, an element defined by the statement "comprising a" does not exclude the presence of additional identical elements in the process, method, article, or apparatus that comprises the element. In the specification of the present invention, if it is mentioned that an action is performed according to an element, it means that the action is performed at least according to the element, which includes two situations: (1) the behavior is performed only according to that element, and (2) the behavior is performed according to that element and other elements. The expressions 'multiple' and 'a plurality of' are defined to mean two or more than two.

The specification includes combinations of the various embodiments described herein. Separate references to embodiments (e.g. "an embodiment" or "some embodiments" or "preferred embodiments") do not necessarily refer to the same embodiment; however, these embodiments are not mutually exclusive unless indicated as such or as will be apparent to those skilled in the art. It should be noted that the word "or" is used in this specification in a non-exclusive sense unless the context expressly indicates or requires otherwise.

All documents mentioned in this specification are deemed as included in the disclosure of this application in their entirety so that they may serve as a basis for amendment if necessary. In addition, it shall be understood that the foregoing are merely better examples of the specification and are not intended to limit the scope of protection of the patent. Any modification, equivalent replacement, improvement, etc. within the spirit and principles of one or more embodiments of this specification shall be included in the scope of protection of such one or more embodiments of this specification.

The invention claimed is:

1. A high-linearity tailless current steering digital-to-analog converter, comprising:

digital-to-analog conversion units for a plurality of bits, each of the digital-to-analog conversion units comprising: first and second load PMOS transistors, first and second load resistors, and first to fourth NMOS transistors, wherein source terminals of the first and second load PMOS transistors are both connected to a power supply terminal, a drain terminal of the first load PMOS transistor is connected to a drain terminal of the first NMOS transistor and an end of the first load resistor, a drain terminal of the second load PMOS transistor is connected to a drain terminal of the second NMOS transistor and an end of the second load resistor, a source terminal of the first NMOS transistor is connected to a drain terminal of the third NMOS transistor, a source terminal of the second NMOS transistor is connected to a drain terminal of the fourth NMOS transistor, gate terminals of the third and fourth NMOS transistors are respectively connected to a pair of differential input signals, and source terminals of the third and fourth NMOS transistors are both connected to a ground terminal;

an operational amplifier, wherein gate terminals of the first and second load PMOS transistors are both connected to an output terminal of the operational amplifier, the other ends of the first and second load resistors are connected to each other at a connection point, the connection point connected to a positive input terminal of the operational amplifier, a negative input terminal of the operational amplifier is connected to a reference voltage, and a first capacitor is connected in series between the output terminal of the operational amplifier and the ground terminal; and a current source connected to gate terminals of the first and second NMOS transistors.

2. The digital-to-analog converter of claim 1, further comprising: fifth and sixth NMOS transistors, wherein a gate terminal and a drain terminal of the fifth NMOS transistor are both connected to the current source, a source terminal of the fifth NMOS transistor is connected to a drain terminal of the sixth NMOS transistor, a gate terminal of the sixth NMOS transistor is connected to the power supply terminal, and a source terminal of the sixth NMOS transistor is connected to the ground terminal.

3. The digital-to-analog converter of claim 1, further comprising: a reference voltage generation circuit that comprises: a voltage divider resistor string, a seventh NMOS transistor and an eighth NMOS transistor, wherein the voltage divider resistor string is connected in series between the power supply terminal and a drain terminal of the seventh NMOS transistor and outputs the reference voltage, a gate terminal of the seventh NMOS transistor is connected to the current source, a source terminal of the seventh NMOS transistor is connected to a drain terminal of the eighth NMOS transistor, a gate terminal of the eighth NMOS transistor is connected to the power supply terminal, a source terminal of the eighth NMOS transistor is connected to the ground terminal, wherein currents of the seventh and eighth NMOS transistors are the same as currents of the first to fourth NMOS transistors of the least significant bit of digital-to-analog conversion unit.

4. The digital-to-analog converter of claim 3, wherein the voltage divider resistor string comprises a plurality of resistors connected in series between the power supply terminal and the drain terminal of the seventh NMOS transistor, and each node between adjacent resistors is connected to the negative input terminal of the operational amplifier via a switch.

5. The digital-to-analog converter of claim 1, further comprising: third and fourth load resistors, wherein the third load resistor is connected in parallel between the source terminal and the drain terminal of the first load PMOS transistor, and the fourth load resistor is connected in parallel between the source terminal and the drain terminal of the second load PMOS transistor.

6. The digital-to-analog converter of claim 1, further comprising: a second capacitor, wherein an end of the second capacitor is connected to gate terminals of the first, second and fifth NMOS transistors, and the other end of the second capacitor is connected to the ground terminal.

7. The digital-to-analog converter of claim 1, further comprising: a third resistor and a third capacitor, wherein the other ends of the first and second load resistors are connected to each other at a connection point, and the third resistor is connected in series between the connection point and the positive input terminal of the operational amplifier, an end of the third capacitor is connected to the positive input terminal of the operational amplifier, and the other end of the third capacitor is connected to the ground terminal.

* * * * *